(12) United States Patent
Ouchi

(10) Patent No.: US 12,328,111 B2
(45) Date of Patent: *Jun. 10, 2025

(54) FILTER

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 226 days.

This patent is subject to a terminal disclaimer.

(21) Appl. No.: 18/096,050

(22) Filed: Jan. 12, 2023

(65) Prior Publication Data

US 2023/0170878 A1 Jun. 1, 2023

Related U.S. Application Data

(63) Continuation of application No. PCT/JP2021/025979, filed on Jul. 9, 2021.

(30) Foreign Application Priority Data

Jul. 15, 2020 (JP) ................................. 2020-121455

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02031* (2013.01); *H03H 9/133* (2013.01); *H03H 9/173* (2013.01)

(58) Field of Classification Search
CPC .... H03H 9/568; H03H 9/02031; H03H 9/133; H03H 9/173; H03H 9/02015; H03H 9/175; H03H 9/542; H03H 9/02228
(Continued)

(56) References Cited

U.S. PATENT DOCUMENTS

2008/0007139 A1\* 1/2008 Kawamura ............ H03H 9/564
310/313 B
2010/0117483 A1\* 5/2010 Tanaka ............... H03H 9/02992
310/313 B
(Continued)

FOREIGN PATENT DOCUMENTS

JP 2012257019 A 12/2012
WO 2016017307 A1 2/2016
(Continued)

OTHER PUBLICATIONS

International Search Report in PCT/JP2021/025979, mailed Aug. 31, 2021, 3 pages.
(Continued)

*Primary Examiner* — Jorge L Salazar, Jr.
(74) *Attorney, Agent, or Firm* — Keating & Bennett, LLP

(57) ABSTRACT

A filter includes a piezoelectric film including lithium niobate or lithium tantalate, an acoustic wave resonator including a functional electrode on the piezoelectric film, a capacitor on the piezoelectric film and connected in parallel to the acoustic wave resonator, and a resonator electrically connected to the acoustic wave resonator. The functional electrode includes a pair of first and second electrodes facing each other in a direction intersecting a thickness direction of the piezoelectric film. When a thickness of the piezoelectric film is d and a center-to-center distance between the first electrode and the second electrode is p, d/p is smaller than or equal to about 0.5.

19 Claims, 7 Drawing Sheets

(51) Int. Cl.
   *H03H 9/13*     (2006.01)
   *H03H 9/17*     (2006.01)
(58) Field of Classification Search
   USPC .......................................... 333/133, 193–196
   See application file for complete search history.

(56) References Cited

U.S. PATENT DOCUMENTS

2017/0141758 A1   5/2017   Ajima
2017/0279432 A1   9/2017   Murase
2022/0014172 A1   1/2022   Nozoe

FOREIGN PATENT DOCUMENTS

WO     2016111315 A1    7/2016
WO     2020100949 A1    5/2020

OTHER PUBLICATIONS

Written Opinion in PCT/JP2021/025979, mailed Aug. 31, 2021, 4 pages.
Ouchi, "Filter", U.S. Appl. No. 18/096,049, filed Jan. 12, 2023.

\* cited by examiner

US 12,328,111 B2

FILTER

CROSS REFERENCE TO RELATED APPLICATIONS

This application claims the benefit of priority to Japanese Patent Application No. 2020-121455 filed on Jul. 15, 2020 and is a Continuation Application of PCT Application No. PCT/JP2021/025979 filed on Jul. 9, 2021. The entire contents of each application are hereby incorporated herein by reference.

BACKGROUND OF THE INVENTION

1. Field of the Invention

The present invention relates to a filter that utilizes an acoustic wave.

2. Description of the Related Art

An acoustic wave device of the related art that utilizes a plate wave propagating through a piezoelectric film formed of $LiNbO_3$ or $LiTaO_3$ is known. Such an acoustic wave device is used for, for example, a ladder filter.

For example, Japanese Unexamined Patent Application Publication No. 2012-257019 discloses an acoustic wave device that utilizes a Lamb wave as the plate wave. Here, a piezoelectric substrate is provided on a support body. The support body, that is, a support substrate includes a cavity portion. The piezoelectric substrate is superposed on the cavity portion. The piezoelectric substrate is formed of $LiNbO_3$ or $LiTaO_3$. An interdigital transducer (IDT) electrode is provided on an upper surface of the piezoelectric substrate. A voltage is applied across a plurality of electrode fingers connected to one potential of the IDT electrode and a plurality of electrode fingers connected to the other potential of the IDT electrode. This excites a Lamb wave. Reflectors are provided on both sides of the IDT electrode. Thus, an acoustic wave resonator that utilizes the plate wave is configured.

In an acoustic wave device described in Japanese Unexamined Patent Application Publication No. 2012-257019, the frequency is adjusted by, for example, adjusting the thickness of the piezoelectric substrate. However, when the above-described acoustic wave device is used for the ladder filter, it is difficult to separately adjust the frequency of individual resonators.

SUMMARY OF THE INVENTION

Preferred embodiments of the present invention provide filters that each enable a frequency of individual resonators to be easily adjusted.

A filter according to a preferred embodiment of the present invention includes a piezoelectric film made of lithium niobate or lithium tantalate, an acoustic wave resonator including a functional electrode on the piezoelectric film, a capacitor on the piezoelectric film and connected in parallel to the acoustic wave resonator, and a resonator electrically connected to the acoustic wave resonator. The functional electrode includes at least one pair of a first electrode and a second electrode. The at least one pair of the first electrode and the second electrode face each other in a direction intersecting a thickness direction of the piezoelectric film. When a thickness of the piezoelectric film is d and a center-to-center distance between the first electrode and the second electrode is p, d/p is smaller than or equal to about 0.5.

Filters according to preferred embodiments of the present invention each enable a frequency of the individual resonators to be easily adjusted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is clarified by describing preferred embodiments of the present invention with reference to the drawings.

Each preferred embodiment described herein is exemplary and configurations can be partially replaced or combined between different preferred embodiments.

Figure 1:
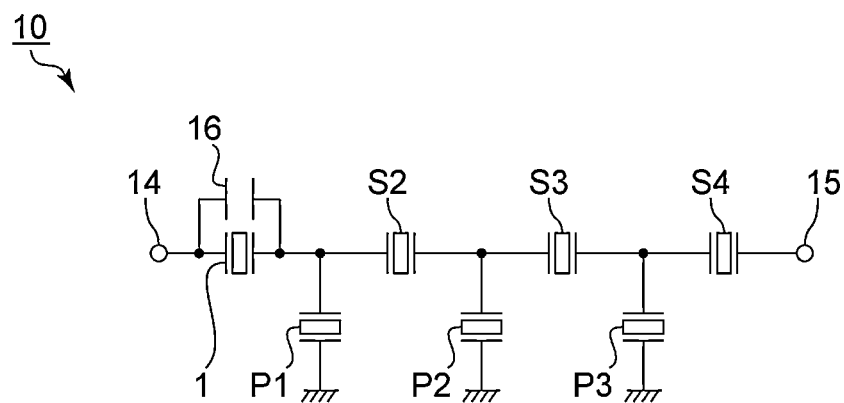
FIG. 1 is a circuit diagram of a ladder filter according to a first preferred embodiment of the present invention.

FIG. 1 is a circuit diagram of a ladder filter according to a first preferred embodiment of the present invention.

As illustrated in FIG. 1, a ladder filter 10 includes a plurality of series arm resonators, a plurality of parallel arm resonators, and a capacitor 16. The plurality of series arm resonators include an acoustic wave resonator 1. The capacitor 16 is connected in parallel to the acoustic wave resonator 1.

Figure 2:
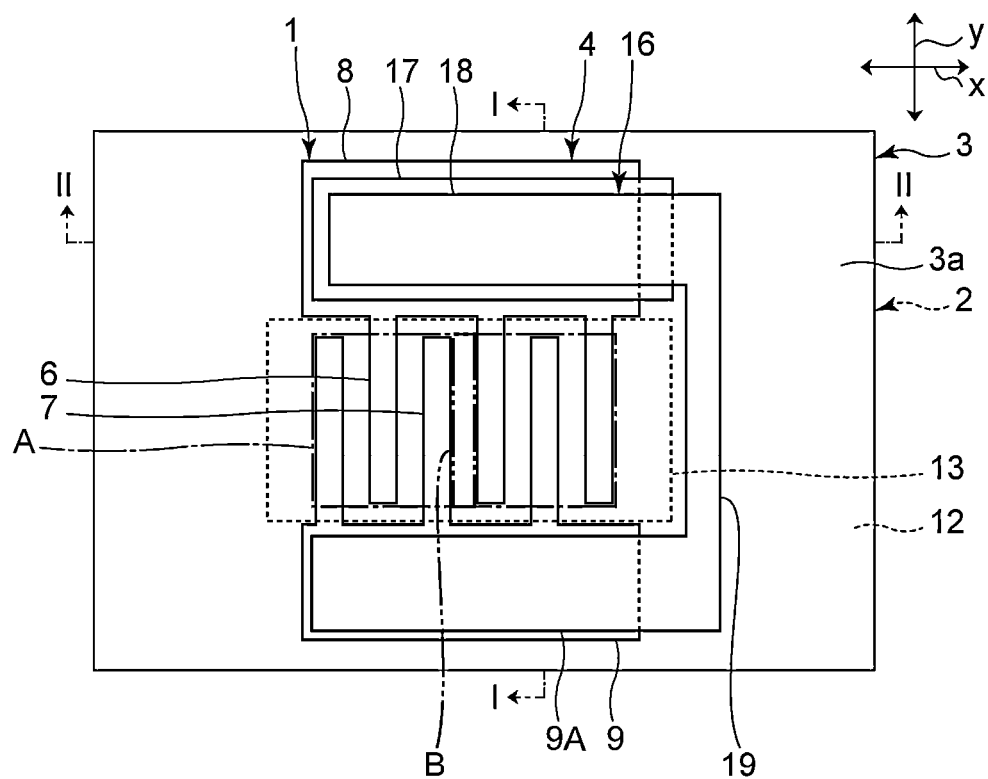
FIG. 2 is a plan view of an acoustic wave resonator and a capacitor according to the first preferred embodiment of the present invention.
Figure 3:
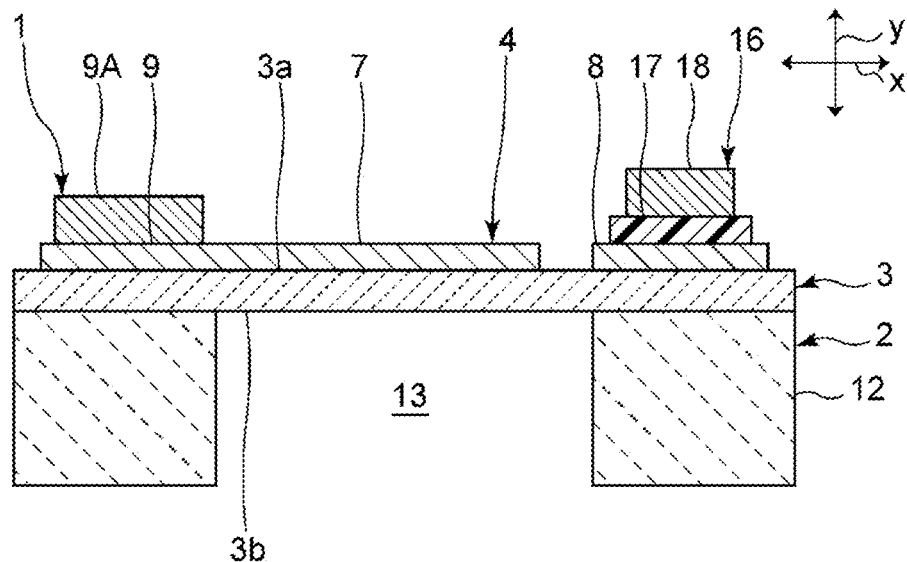
FIG. 3 is a sectional view taken along line I-I of FIG. 2.

FIG. 2 is a plan view of the acoustic wave resonator and the capacitor according to the first preferred embodiment. FIG. 3 is a sectional view taken along line I-I of FIG. 2. In FIGS. 2 and 3, wiring for connection to the other resonators or terminals is omitted. This also similarly applies to other plan views and sectional views.

As illustrated in FIG. 2, the acoustic wave resonator 1 includes a piezoelectric film 3. As illustrated in FIG. 3, the piezoelectric film 3 includes a first main surface 3a and a second main surface 3b. The first main surface 3a and the second main surface 3b are on opposite sides of the piezoelectric film 3 from each other. The piezoelectric film 3 is, for example, a lithium niobate film according to the present preferred embodiment. More specifically, the piezoelectric film 3 is, for example, an $LiNbO_3$ film. Alternatively, the piezoelectric film 3 may be, for example, a lithium tantalate film. More specifically, for example, an $LiTaO_3$ film may be used as the piezoelectric film 3. The thickness of the piezoelectric film 3 is preferably greater than or equal to about 40 nm and smaller than or equal to about 1000 nm, for example.

Referring back to FIG. 2, a functional electrode 4 is provided on the first main surface 3a of the piezoelectric film 3. The functional electrode 4 includes a plurality of electrodes. The plurality of electrodes are arranged in a direction intersecting the thickness direction of the piezoelectric film 3. Each of the electrodes has a rectangular or substantially rectangular shape. The plurality of electrodes include a plurality of pairs of a first electrode 6 and a second electrode 7. According to the present preferred embodiment, the first electrode 6 and the second electrode 7 extend in parallel or substantially in parallel. The first electrode 6 and the second electrode 7 adjacent to each other face each other in a direction orthogonal or substantially orthogonal to a direction in which the first electrode 6 extends. In the following, the direction in which the first electrode 6 extends is defined as the y direction and a direction orthogonal or substantially orthogonal to the y direction is defined as the x direction. Both the x direction and the y direction are directions that intersect the thickness direction of the piezoelectric film 3. Accordingly, it can be said that the first electrode 6 and the second electrode 7 adjacent to each other face each other in the direction intersecting the thickness direction of the piezoelectric film 3.

The functional electrode 4 includes a first busbar 8 and a second busbar 9. The first busbar 8 and the second busbar 9 face each other. One end portion of each of a plurality of the first electrodes 6 is connected to the first busbar 8. One end portion of each of a plurality of the second electrodes 7 is connected to the second busbar 9. The plurality of first electrodes 6 and the plurality of second electrodes 7 are interdigitated with each other. The first electrode 6 and the second electrode 7 are connected to respective potentials different from each other. According to the present preferred embodiment, the functional electrode 4 is, for example, an interdigital transducer (IDT) electrode. However, the functional electrode 4 is not limited to the IDT electrode. It is sufficient that the functional electrode 4 includes at least a pair of the first electrode 6 and the second electrode 7.

The functional electrode 4 is made of appropriate metal or an appropriate alloy such as, for example, Al or an AlCu alloy. A Cu content in an AlCu alloy is preferably, for example, greater than or equal to about 1 weight % and smaller than or equal to about 20 weight %. The functional electrode 4 may be defined by a multilayered metal film. In this case, for example, an adhesion layer may be included. Examples of the adhesion layer include, for example, a Ti layer, a Cr layer, and so forth.

As illustrated in FIG. 2, the functional electrode 4 includes an intersecting region A. In the intersecting region A, the electrodes adjacent to each other are superposed on each other when seen in the x direction. The intersecting region A extends, in the x direction, from one of outermost electrodes of the functional electrode 4 to the other outermost electrode of the functional electrode 4. The intersecting region A includes outer end portions of the outermost electrodes in the x direction.

As illustrated in FIG. 3, an insulation film 17 is provided on the first busbar 8 of the functional electrode 4. A capacitance electrode 18 is provided on the insulation film 17. The first busbar 8 and the capacitance electrode 18 are electrically insulated from each other by the insulation film 17. The first busbar 8 and the capacitance electrode 18 face each other with the insulation film 17 interposed therebetween. The capacitor 16 includes the first busbar 8, the insulation film 17, and the capacitance electrode 18.

Referring back to FIG. 2, a connection electrode 19 is provided on the first main surface 3a of the piezoelectric film 3. The connection electrode 19 electrically connects the capacitance electrode 18 and the second busbar 9 to each other. Thus, the capacitor 16 is connected in parallel to the acoustic wave resonator 1. Also referring to FIG. 2, the plurality of first electrodes 6 and the plurality of second electrodes 7 are surrounded by the connection electrode 19, the first busbar 8, and the second busbar 9. Herein, "surrounded" includes not only a case where an outer periphery of the first electrodes 6 and the second electrodes 7 are entirely surrounded but also a case where, as illustrated in FIG. 2, the outer periphery of the first electrodes 6 and the second electrodes 7 are surrounded in any three directions. The outer periphery refers to a portion where portions of the plurality of first electrodes 6 connected to the first busbar 8, portions of the plurality of second electrodes 7 connected to the second busbar 9, and outer edges of two outermost electrodes out of the plurality of first electrodes 6 and second electrodes 7 interdigitated with each other are connected to each other.

As illustrated in FIG. 3, the acoustic wave resonator 1 includes a support substrate 2. The piezoelectric film 3 is provided on the support substrate 2. Of the first main surface 3a and the second main surface 3b of the piezoelectric film 3, the second main surface 3b is a main surface at the support substrate 2 side. According to the present preferred embodiment, the resonators of the ladder filter 10 share the support substrate 2 and the piezoelectric film 3. Thus, productivity can be improved.

The support substrate 2 includes a cavity portion 13 and a support portion 12. The support portion 12 has a frame shape. The cavity portion 13 is, for example, a through hole provided in the support substrate 2. Alternatively, the cavity portion 13 may be, for example, a recessed portion provided in the support substrate 2.

The support substrate 2 is, for example, a silicon substrate. The plane orientation in a surface of the support substrate 2 on the piezoelectric film 3 side is preferably, for example, (100), (110), or (111). The resistivity of the support substrate 2 is preferably, for example, greater than or equal to about 4 kΩ. However, the material of the support substrate 2 is not limited to the above description, and examples of the material of the support substrate 2 can include piezoelectric materials such as aluminum oxide, lithium tantalate, lithium niobate, and crystal, various types of ceramics such as alumina, sapphire, silicon nitride, aluminum nitride, silicon carbide, zirconia, cordierite, mullite, steatite, and forsterite, dielectrics such as diamond and glass, semiconductors such as gallium nitride, and so forth.

The piezoelectric film 3 is provided on the support portion 12 of the support substrate 2 so as to cover the cavity portion 13. In plan view, the entirety or substantially the entirety of the intersecting region A is superposed on the cavity portion 13. Herein, "plan view" refers to a direction of viewed from above in FIG. 3.

The characteristics of the present preferred embodiment are that a bulk wave in a thickness slip mode is utilized, and the capacitor 16 is connected in parallel to the acoustic wave resonator 1. Thus, the frequency of the individual resonators can be easily adjusted. Furthermore, since the bulk wave in the thickness slip mode is utilized, size reduction can be facilitated. The details of the advantageous effects of the present invention and the details of the circuit configuration of the ladder filter 10 will be described below.

As illustrated in FIG. 1, the ladder filter 10 includes a first signal terminal 14 and a second signal terminal 15. According to the present preferred embodiment, the first signal terminal 14 is to be connected to an antenna. The first signal terminal 14 and the second signal terminal 15 may be configured as wires or electrode pads, for example. The acoustic wave resonator 1, a series arm resonator S2, a series arm resonator S3, and a series arm resonator S4 are connected in this order in series to each other between the first signal terminal 14 and the second signal terminal 15. The capacitor 16 is connected in parallel to the acoustic wave resonator 1.

A parallel arm resonator P1 is connected between a ground potential and a junction between the acoustic wave resonator 1 and the series arm resonator S2. A parallel arm resonator P2 is connected between a ground potential and a junction between the series arm resonator S2 and the series arm resonator S3. A parallel arm resonator P3 is connected between a ground potential and a junction between the series arm resonator S3 and the series arm resonator S4. According to the present preferred embodiment, other than the acoustic wave resonator 1, all of the plurality of series arm resonators and the plurality of parallel arm resonators are acoustic wave resonators. However, this is not limited thereto.

The acoustic wave resonator 1 is positioned closest to the first signal terminal 14 in the circuit configuration of the ladder filter 10. The circuit configuration of the ladder filter 10 is not limited to the configuration illustrated in FIG. 1. It is sufficient that the ladder filter 10 includes the acoustic wave resonator 1, at least one resonator other than the acoustic wave resonator 1, and the capacitor 16. It is sufficient that the resonators other than the acoustic wave resonator 1 and the acoustic wave resonator 1 are electrically connected, and the capacitor 16 is connected in parallel to the acoustic wave resonator 1. The acoustic wave resonator 1 may be a parallel arm resonator.

As illustrated in FIG. 2, layered wiring 9A is laminated on the second busbar 9 of the acoustic wave resonator 1. This layered wiring 9A is connected to the first signal terminal 14 illustrated in FIG. 1. The layered wiring 9A may be connected to the series arm resonator S2 and the parallel arm resonator P1. When the layered wiring 9A is provided, electrical resistance of the functional electrode 4 can be reduced. The connection electrode 19 is electrically connected to the layered wiring 9A and the second busbar 9. According to the present preferred embodiment, the capacitance electrode 18, the connection electrode 19, and the layered wiring 9A are integrally provided. The layered wiring 9A is not necessarily provided. Alternatively, the capacitance electrode 18, the connection electrode 19, and the layered wiring 9A may be separately provided and connected to each other. However, when the above-described electrodes are integrally provided as in the present preferred embodiment, the productivity can be improved. In addition, since no contact resistance is generated, resistance of wiring can be reduced.

The details of the advantageous effects of the present preferred embodiment will be described below.

Figure 4:
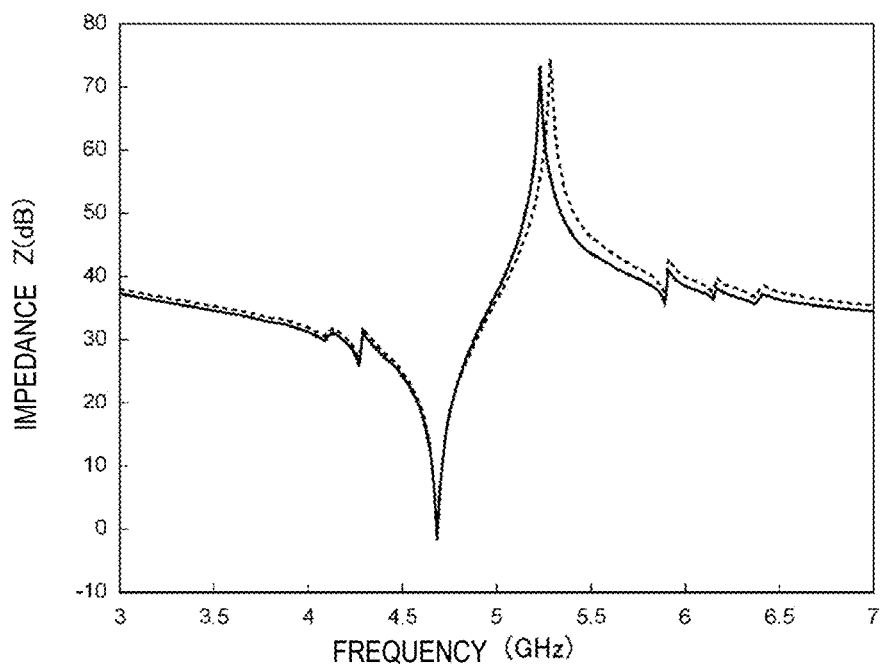
FIG. 4 is a diagram illustrating an impedance characteristic when the capacitance of the capacitor is varied in a circuit configuration in which the acoustic wave resonator and the capacitor are connected in parallel to each other according to the first preferred embodiment of the present invention.

FIG. 4 is a diagram illustrating an impedance characteristic when the capacitance of the capacitor is varied in the circuit configuration in which the acoustic wave resonator and the capacitor are connected in parallel to each other according to the first preferred embodiment. Referring to FIG. 4, the capacitance of the capacitor 16 is different between a result represented by a solid line and a result represented by a broken line.

As illustrated in FIG. 4, it can be understood that, when the capacitance of the capacitor 16 is varied, the anti-resonant frequency of the acoustic wave resonator 1 varies. As described above, the frequency of the acoustic wave resonator 1 can be separately easily adjusted. To adjust the capacitance of the capacitor 16, for example, the thickness of the insulation film 17 can be adjusted. Alternatively, for example, the area in which the first busbar 8 and the capacitance electrode 18 face each other can be adjusted.

Figure 5:
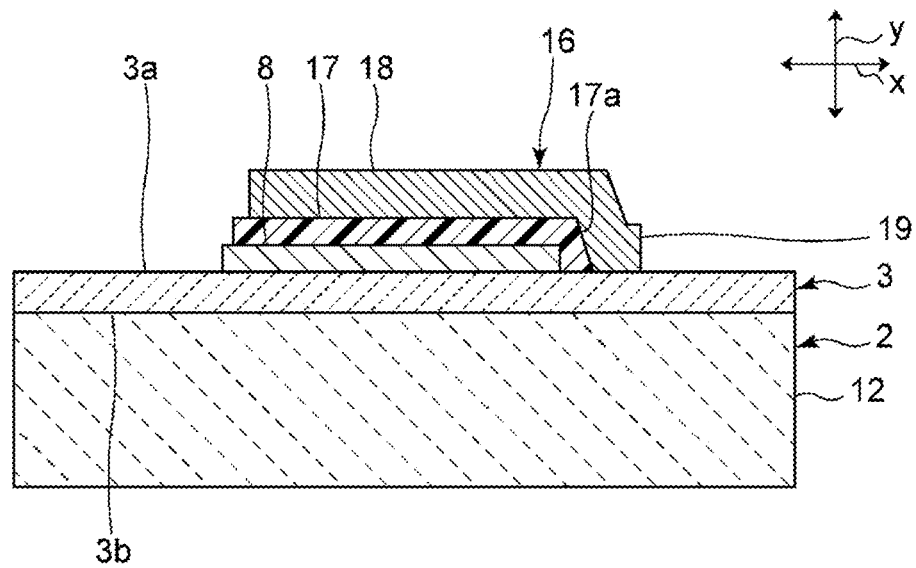
FIG. 5 is a sectional view taken along line II-II of FIG. 2.

FIG. 5 is a sectional view taken along line II-II of FIG. 2.

The insulation film 17 of the capacitor 16 extends from a portion on the first busbar 8 to a portion on the first main surface 3a of the piezoelectric film 3. The insulation film 17 includes an inclined portion 17a in a portion thereof that extends from a portion on the first busbar 8 to a portion on the first main surface 3a. The inclined portion 17a is inclined relative to a normal line to the first main surface 3a. An electrode with which the capacitance electrode 18 and the connection electrode 19 are configured extends from a portion above the first busbar 8 to a portion on the first main surface 3a through a portion on the inclined portion 17a. Thus, stress applied to the electrode can be reduced. Accordingly, wires are unlikely to break. However, the insulation film 17 does not necessarily include the inclined portion 17a.

According to the present preferred embodiment, the insulation film 17 covers one end portion of the first busbar 8 in a direction in which the first busbar 8 extends. In contrast, the insulation film 17 does not cover the other end portion of the first busbar 8. However, the insulation film 17 may cover both of the end portions of the first busbar 8.

The connection electrode 19 is preferably superposed on the support portion 12 of the support substrate 2 in plan view. More preferably, the connection electrode 19 is not superposed on the cavity portion 13 in plan view. Thus, stress applied to a portion in which the piezoelectric film 3 faces the cavity portion 13 can be reduced. Accordingly, cracks in the piezoelectric film 3 can be further reduced or prevented.

Meanwhile, according to the present preferred embodiment, no reflector is provided on the piezoelectric film 3. The acoustic wave resonator 1 does not include the reflector. Since the acoustic wave resonator 1 does not require the reflector, size reduction can be facilitated. The reason why propagation loss is reduced or prevented even in this case is that the acoustic wave resonator 1 utilizes the bulk wave in the thickness slip mode. More specifically, the acoustic wave resonator 1 utilizes the bulk wave in a primary thickness slip mode. The details of the thickness slip mode that the acoustic wave resonator 1 utilizes will be described below.

As illustrated in FIG. 2, a plurality of pairs of the first electrode 6 and the second electrode 7 adjacent to each are provided in the x direction. This number of pairs is not necessarily an integer and may be, for example 1.5 pairs, 2.5 pairs, or the like. The case where the electrodes in the functional electrode 4 are adjacent to each other refers not to a case where the electrodes are arranged so as to be in direct contact with each other but to a case where the electrodes are arranged with a gap interposed therebetween. When the first electrode 6 and the second electrode 7 are adjacent to each other, another hot electrode or ground electrode is not disposed between the first electrode 6 and the second electrode 7.

To drive the acoustic wave resonator 1, an alternating-current voltage is applied across the plurality of first electrode 6 and the plurality of second electrode 7. More specifically, the alternating-current voltage is applied across the first busbar 8 and the second busbar 9. Thus, a resonance characteristic utilizing the bulk wave in the thickness slip mode excited in the piezoelectric film 3 can be obtained. As described above, a region between the first electrode 6 and the second electrode 7 is an exciting region B. Although a single exciting region B is indicated as an example in FIG. 2, all regions between the plurality of first electrodes 6 and the plurality of second electrodes 7 are exciting regions B. The exciting regions B are included in the intersecting region A.

In the acoustic wave resonator 1, when the thickness of the piezoelectric film 3 is d and the center-to-center distance between the first electrode 6 and the second electrode 7 adjacent to each other in any one pair out of the plurality of pairs of the first electrode 6 and the second electrode 7 is p, d/p is smaller than or equal to about 0.5, for example. Thus, the bulk wave in the thickness slip mode can be effectively excited, and a good resonance characteristic can be obtained. Here, the center-to-center distance between the first electrode 6 and the second electrode 7 is a distance between the center of the first electrode 6 in the x direction and the center of the second electrode 7 in the x direction.

The acoustic wave resonator 1 includes the above-described configuration and utilizes the thickness slip mode. Thus, the quality factor is unlikely to reduce even when the number of pairs of the first electrode 6 and the second electrode 7 is reduced.

According to the present preferred embodiment, the piezoelectric film 3 is a Z-cut piezoelectric film. Accordingly, the x direction is a direction orthogonal or substantially orthogonal to the polarization direction of the piezoelectric film 3. This is not limiting when the piezoelectric film 3 is a piezoelectric film with another cut angle.

The difference between the bulk wave in the thickness slip mode and a Lamb wave utilized in the related-art will be described with reference to FIGS. 6A and 6B.

Figure 6A:
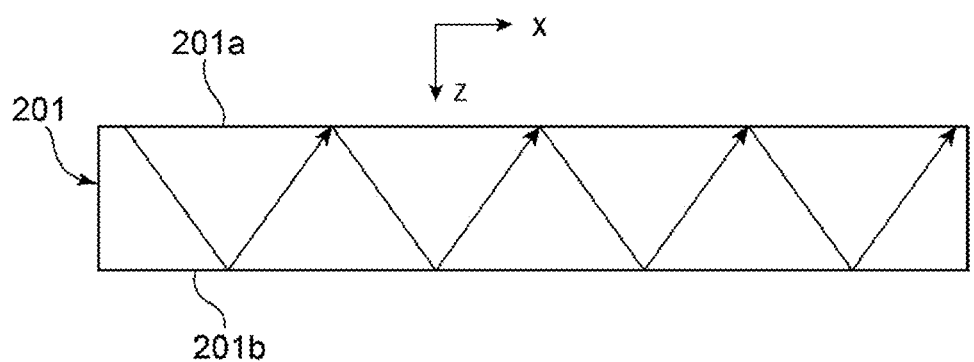
FIG. 6A is a schematic elevational cross-sectional view for explaining the Lamb wave propagating through a piezoelectric film of an acoustic wave resonator of the related art.

FIG. 6A is a schematic elevational cross-sectional view for explaining the Lamb wave propagating through the piezoelectric film of the acoustic wave resonator as described in Japanese Unexamined Patent Application Publication No. 2012-257019. Here, the wave propagates through a piezoelectric film 201 as indicated by arrows. Here, in the piezoelectric film 201, a first main surface 201a and a second main surface 201b are on opposite sides of the piezoelectric film 201 from each other. The thickness direction connecting the first main surface 201a and the second main surface 201b is the z direction. The x direction is a direction in which electrode fingers of an IDT electrode are arranged. As illustrated in FIG. 6A, the Lamb wave propagates in the x direction. Since the Lamb wave is a plate wave, although the piezoelectric film 201 entirely vibrates, the wave propagates in the x direction. Accordingly, reflectors are disposed on both sides of the IDT electrode in the x direction so as to obtain the resonance characteristic.

Figure 6B:
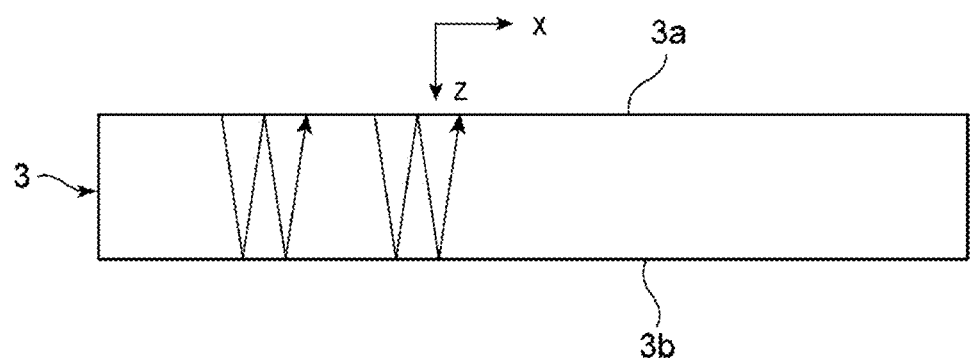
FIG. 6B is a schematic elevational cross-sectional view for explaining a bulk wave in a thickness slip mode propagating through a piezoelectric film of the acoustic wave resonator according to the first preferred embodiment of the present invention.

In contrast, as illustrated in FIG. 6B, in the acoustic wave resonator according to the present preferred embodiment, the vibration displacement occurs in the thickness slip direction. Thus, the wave substantially propagates in the z direction and resonates. Accordingly, an x direction component of the wave is significantly smaller than a z direction component of the wave. Since the resonance characteristic is obtained due to propagation of the wave in the z direction, propagation loss is unlikely to occur even when the number of electrode fingers of the reflectors is reduced. Furthermore, the quality factor is unlikely to reduce even when, to facilitate the size reduction, the number of electrode pairs of the first electrode 6 and the second electrode 7 is reduced.

Figure 7:
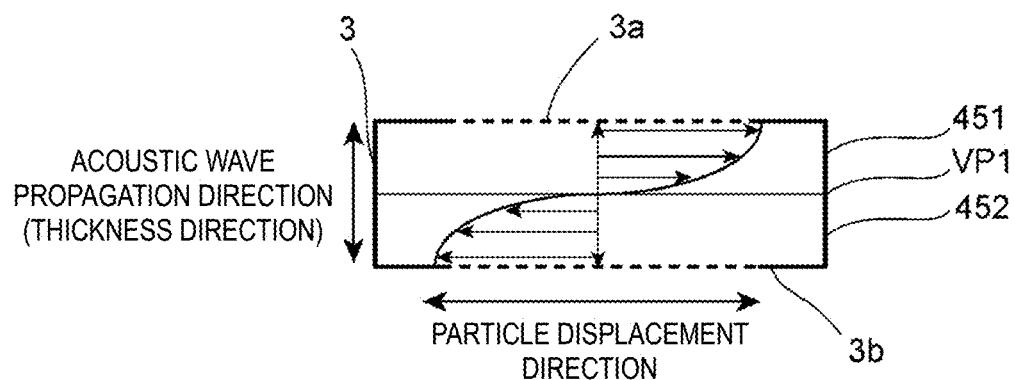
FIG. 7 is a diagram illustrating an amplitude width direction of the bulk wave in the thickness slip mode.

As illustrated in FIG. 7, amplitude width directions of the bulk wave in the thickness slip mode in a first region 451 included in the exciting region of the piezoelectric film 3 and in a second region 452 included in the exciting region are opposite to each other. FIG. 7 schematically illustrates the bulk wave when a voltage with which the potential is higher at the second electrode 7 than at the first electrode 6 is applied across the first electrode 6 and the second electrode 7. The first region 451 is, of the exciting region, a region between the first main surface 3a and a virtual plane VP1 that is orthogonal or substantially orthogonal to the thickness direction of the piezoelectric film 3 and that bifurcates the piezoelectric film 3. The second region 452 is, of the exciting region, a region between the second main surface 3b and the virtual plane VP1.

As described above, the plurality of pairs of the first electrode 6 and the second electrode 7 are disposed in the acoustic wave resonator 1. Since the wave does not propagate in the x direction in the thickness slip mode, it is not required that the plurality of electrode pairs of the first electrode 6 and the second electrode 7 are provided. In other words, it is sufficient that at least a single pair of the first electrode 6 and the second electrode 7 is provided.

Meanwhile, d/p is, for example, smaller than or equal to about 0.5 according to the present preferred embodiment. Preferably, d/p is, for example, smaller than or equal to about 0.24. In this case, a better resonance characteristic can be obtained. This will be described with reference to FIG. 8.

Figure 8:
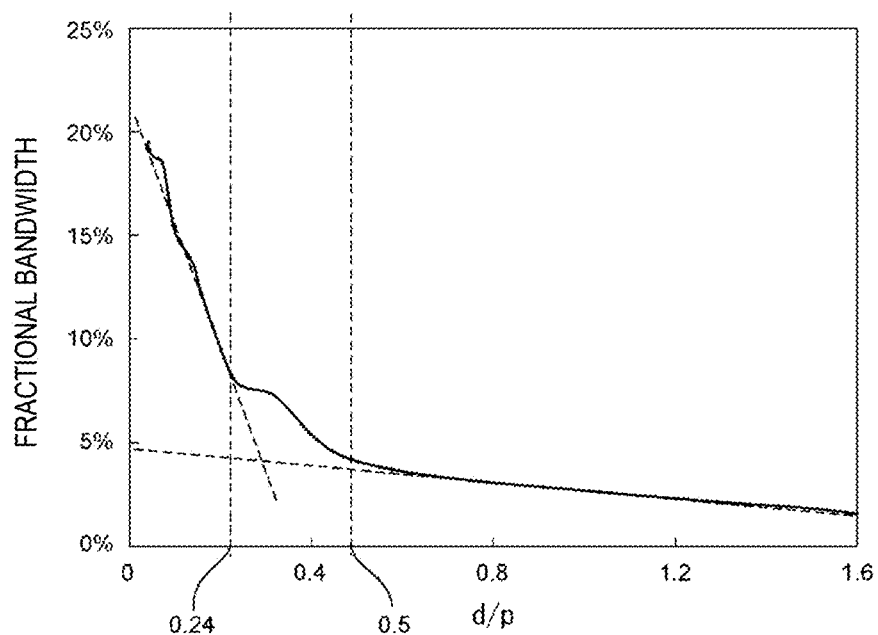
FIG. 8 is a diagram illustrating the relationship between a fractional bandwidth of the acoustic wave resonator and d/p when a center-to-center distance or an average center-to-center distance between a first electrode and a second electrode adjacent to each other is p and the thickness of the piezoelectric film is d.

A plurality of acoustic wave resonators are obtained with d/p varied. FIG. 8 is a diagram illustrating the relationship between d/p and a fractional bandwidth of the acoustic wave resonator.

As clearly understood from FIG. 8, when d/p>about 0.5, the fractional bandwidth is smaller than about 5% even when d/p is adjusted. In contrast, when d/p≤about 0.5, by varying d/p within the range, the fractional bandwidth of greater than or equal to about 5% can be obtained. Thus, a resonator having a high coupling coefficient can be obtained. Furthermore, when d/p is smaller than or equal to about 0.24, the fractional bandwidth can be increased to a percentage greater than or equal to about 7%. In addition, when d/p is adjusted within this range, a resonator having a wider fractional bandwidth can be obtained, and accordingly, a resonator having a higher coupling coefficient can be obtained. For example, when there is a variation in the thickness of the piezoelectric film 3, a value obtained by averaging the thicknesses, that is, an average thickness can be used.

The center-to-center distance p between the first electrode 6 and the second electrode 7 adjacent to each is preferably, for example, greater than or equal to about 1 μm and smaller than or equal to about 10 μm. When the dimensions of the plurality of electrodes of the functional electrode 4 in the x direction are defined as a width, the width of each of the first electrode 6 and the second electrode 7 is preferably, for example, greater than or equal to about 50 nm and smaller than or equal to about 1000 nm.

As described above, since the acoustic wave resonator 1 utilizes the bulk wave in the thickness slip mode, size reduction can be facilitated. Furthermore, the capacitor 16 includes the first busbar 8 and is configured so as to be integrated with the acoustic wave resonator 1. The capacitor 16 is superposed on the acoustic wave resonator 1 in plan view. Accordingly, size reduction of the acoustic wave resonator 1 can be further facilitated.

According to the present preferred embodiment, the acoustic wave resonator 1 and the capacitor 16 are connected in parallel to each other. However, the other resonators in the ladder filter 10 may be respectively connected in parallel to other capacitors than the capacitor 16. In this case, the frequency can be separately easily adjusted also in the other resonators.

An example of a ladder filter has been described according to the first preferred embodiment, the filter according to the present invention is not limited to the ladder filter.

Figure 9:
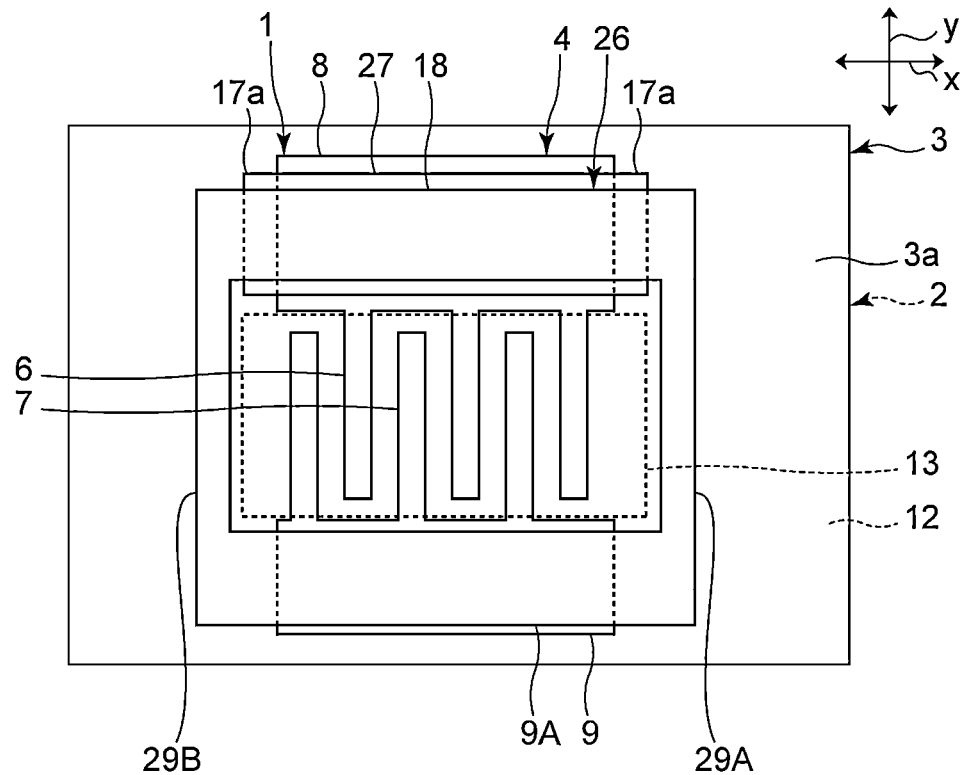
FIG. 9 is a plan view of an acoustic wave resonator and a capacitor according to a second preferred embodiment of the present invention.

FIG. 9 is a plan view of the acoustic wave resonator and a capacitor according to a second preferred embodiment of the present invention.

According to the present preferred embodiment, the configuration of the electrode that connects a capacitor 26 and the second busbar 9 of the acoustic wave resonator 1 to each other and the position of an insulation film 27 are different from those of the first preferred embodiment. Other than the above-described points, a ladder filter according to the present preferred embodiment has the same or similar configuration to that of the ladder filter 10 according to the first preferred embodiment.

The insulation film 27 covers both of the end portions of the first busbar 8 in the direction in which the first busbar 8 extends. The insulation film 27 includes inclined portions 17a in portions that cover the respective end portions of the first busbar 8. A first connection electrode 29A and a second connection electrode 29B are connected to the capacitance electrode 18 of the capacitor 26.

The first connection electrode 29A electrically connects one end portion of the second busbar 9 and the capacitance electrode 18 to each other. The second connection electrode 29B electrically connects the other end portion of the second busbar 9 and the capacitance electrode 18 to each other. The first connection electrode 29A and the second connection electrode 29B face each other in the x direction. According to the present preferred embodiment, the capacitance electrode 18, the first connection electrode 29A, the second connection electrode 29B, and the layered wiring 9A are integrally provided.

As illustrated in FIG. 9, the first electrodes 6 and the second electrodes 7 are surrounded by the first connection electrode 29A, the second connection electrode 29B, the first busbar 8, and the second busbar 9. Thus, heat releasing paths can be increased, and accordingly, a heat releasing property can be improved. Furthermore, since an imbalance between portions to which heat stress or the like is applied can be reduced, cracks in the piezoelectric film 3 can be reduced or prevented.

The first connection electrode 29A and the second connection electrode 29B are preferably superposed on the support portion 12 of the support substrate 2 in plan view. More preferably, neither the first connection electrode 29A nor the second connection electrode 29B is superposed on the cavity portion 13 in plan view. Thus, stress applied to a portion in which the piezoelectric film 3 faces the cavity portion 13 can be reduced. Accordingly, cracks in the piezoelectric film 3 can be further reduced or prevented.

In addition, the frequency of the acoustic wave resonator 1 can be separately easily adjusted by adjusting the capacitance of the capacitor 26. Thus, similarly to the first preferred embodiment, the frequency of the individual resonators can be easily adjusted.

Figure 10:
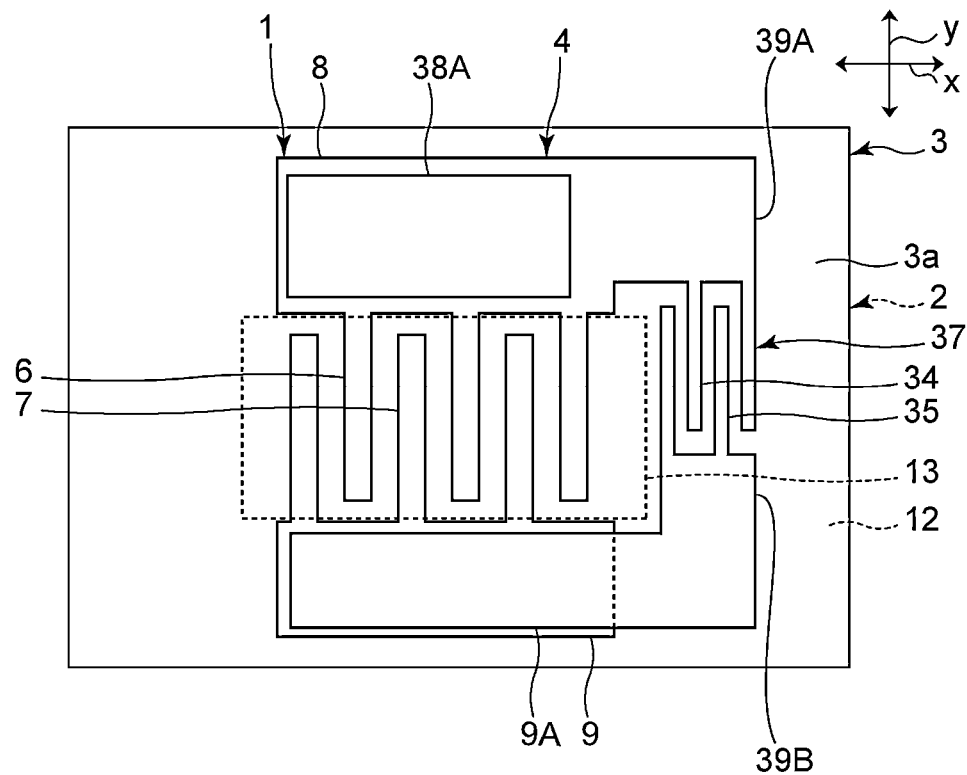
FIG. 10 is a plan view of an acoustic wave resonator and a capacitor according to a third preferred embodiment of the present invention.

FIG. 10 is a plan view of the acoustic wave resonator and a capacitor according to a third preferred embodiment of the present invention.

The present preferred embodiment is different from the first preferred embodiment in that the insulation film 17 is not provided, the capacitor 16 is not provided, and a second capacitor 37 is provided according to the present preferred embodiment. As described above, the capacitor integrated with the first busbar 8 is not necessarily provided. The present preferred embodiment is also different from the first preferred embodiment in that layered wiring 38A is laminated on the first busbar 8 according to the present preferred embodiment. Other than the above-described points, a ladder filter according to the present preferred embodiment has the same or similar configuration to that of the ladder filter 10 according to the first preferred embodiment.

Since both of the layered wiring 38A and the layered wiring 9A are provided as illustrated in FIG. 10, electrical resistance of the functional electrode 4 can be effectively reduced.

The second capacitor 37 includes a first comb-shaped electrode 34 and a second comb-shaped electrode 35. Each of the first comb-shaped electrode 34 and the second comb-shaped electrode 35 includes a plurality of electrode fingers. The first comb-shaped electrode 34 and the second comb-shaped electrode 35 are provided on the first main surface 3a of the piezoelectric film 3. The first comb-shaped electrode 34 is electrically connected to the layered wiring 38A and the first busbar 8 by using a first wiring electrode 39A. Specifically, the first busbar 8 is connected to the first wiring electrode 39A. Meanwhile, the second comb-shaped electrode 35 is electrically connected to the second busbar 9 by using a second wiring electrode 39B. The first comb-shaped electrode 34 and the second comb-shaped electrode 35 are interdigitated with each other. The first comb-shaped electrode 34 and the second comb-shaped electrode 35 are superposed on the support portion 12 of the support substrate 2 in plan view. Neither the first comb-shaped electrode 34 nor the second comb-shaped electrode 35 is superposed on the cavity portion 13 in plan view.

The second capacitor 37 includes, similarly to the functional electrode 4, an intersecting region. The intersecting region is a region where the electrode fingers adjacent to each other are superposed on each other when seen in a direction orthogonal or substantially orthogonal to a direction in which each electrode finger of the second capacitor 37 extends. The dimension of the intersecting region of the second capacitor 37 in the direction in which each electrode finger extends is defined as an intersecting width of the second capacitor 37.

The frequency of the acoustic wave resonator 1 can be separately easily adjusted by adjusting the capacitance of the second capacitor 37. Thus, similarly to the first preferred embodiment, the frequency of the individual resonators can be easily adjusted. To adjust the capacitance by using the second capacitor 37, for example, the intersecting width can be adjusted. Alternatively, for example, the number of pairs of the electrode fingers of the second capacitor 37 can be adjusted.

Also when the second capacitor 37 is provided, similarly to the second preferred embodiment, the first electrodes 6 and the second electrodes 7 may be surrounded by the electrodes. Also in this case, the frequency of the individual resonators can be easily adjusted.

Figure 11:
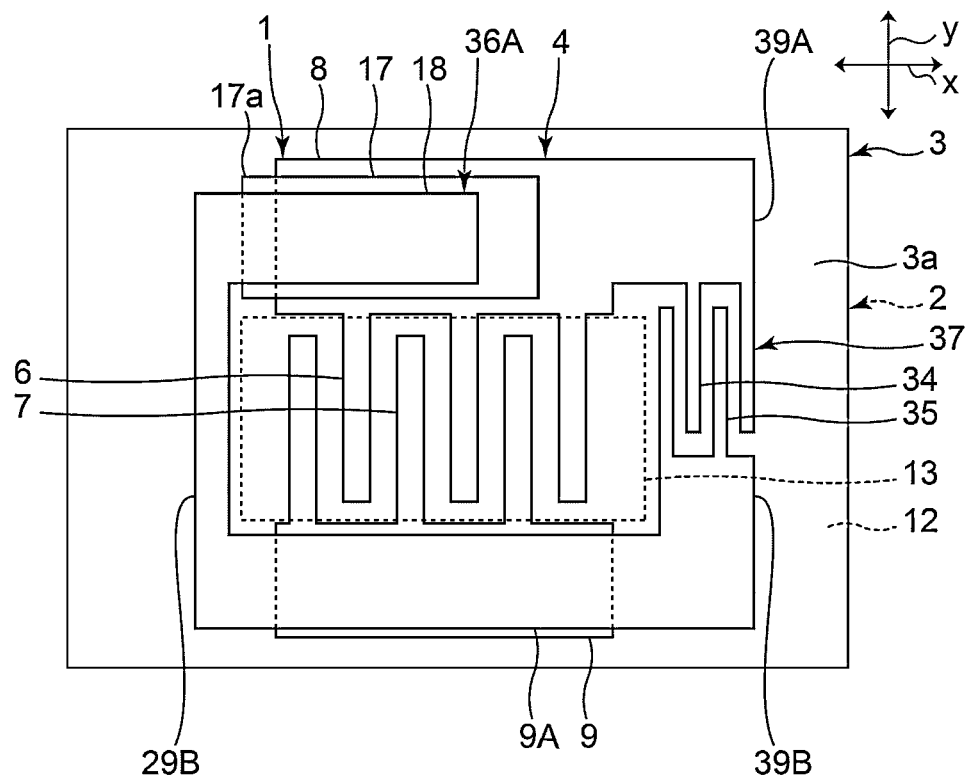
FIG. 11 is a plan view of an acoustic wave resonator and capacitor according to a modification of the third preferred embodiment of the present invention.

For example, according to a modification of the third preferred embodiment illustrated in FIG. 11, a first capacitor 36A is configured. Similarly to the second preferred embodiment, the first capacitor 36A includes the first busbar 8, the insulation film 17, and the capacitance electrode 18. Furthermore, the second busbar 9 and the capacitance electrode 18 are electrically connected to each other by using the second connection electrode 29B. The insulation film 17 covers only one end portion of the first busbar 8 in the direction in which the first busbar 8 extends. More specifically, the insulation film 17 covers the end portion of the first busbar 8 on the second connection electrode 29B side. When seen in the y direction, the capacitance electrode 18 is superposed on one end portion of the intersecting region but is not superposed on the other end portion of the intersecting region. However, when seen in the y direction, the capacitance electrode 18 may be superposed on the entirety or substantially the entirety of the intersecting region. When seen in the x direction and the y direction, the first electrodes 6 and the second electrodes 7 are surrounded by the first wiring electrode 39A, the second capacitor 37, the second wiring electrode 39B, the second connection electrode 29B, the first busbar 8, and the second busbar 9. Thus, similarly to the second preferred embodiment, the heat releasing property can be improved and cracks in the piezoelectric film 3 can be reduced or prevented.

Figure 12:
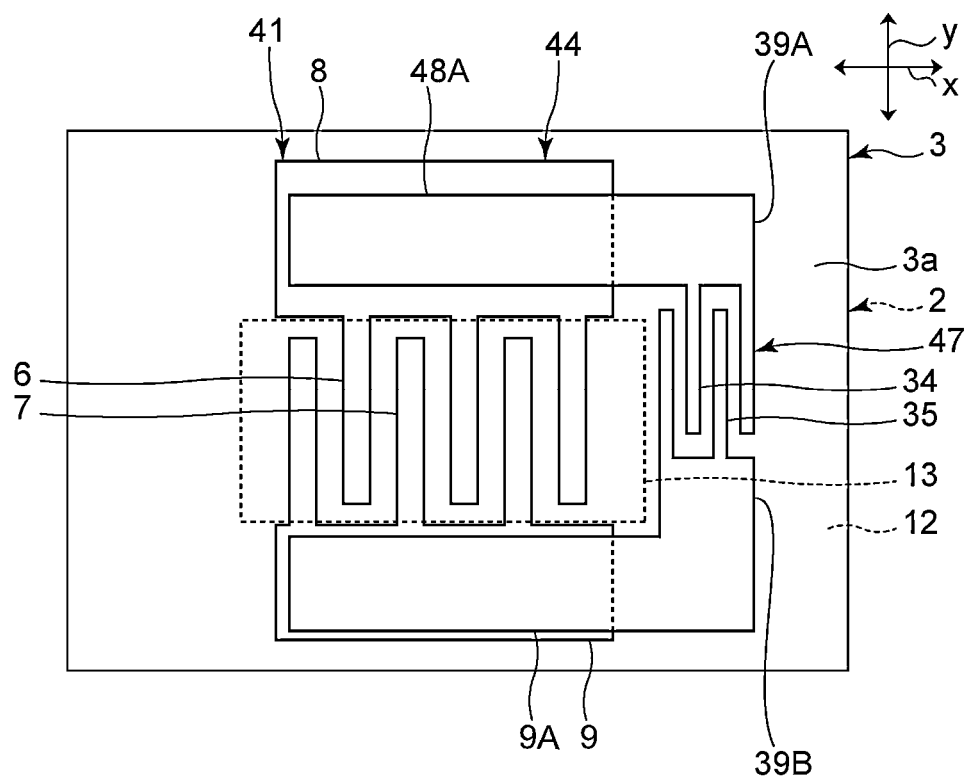
FIG. 12 is a plan view of an acoustic wave resonator and a capacitor according to a fourth preferred embodiment of the present invention.

FIG. 12 is a plan view of an acoustic wave resonator and a capacitor according to a fourth preferred embodiment of the present invention.

There is a difference in disposition of layered wiring 48A on the first busbar 8 between the present preferred embodiment and the third preferred embodiment. Other than the above-described point, a ladder filter according to the present preferred embodiment has the same or similar configuration to that of the ladder filter according to the third preferred embodiment.

A capacitor 47 is similarly configured to the second capacitor 37. The first comb-shaped electrode 34 of the capacitor 47 is electrically connected to the layered wiring 48A and the first busbar 8 by using the first wiring electrode 39A. Specifically, the layered wiring 48A is connected to the first wiring electrode 39A. The second comb-shaped electrode 35 is electrically connected to the layered wiring 9A and the second busbar 9 by using the second wiring electrode 39B. Also according to the present preferred embodiment, the capacitor 47 is connected in parallel to an acoustic wave resonator 41.

The frequency of the acoustic wave resonator 41 can be separately easily adjusted by adjusting the capacitance of the capacitor 47. Thus, similarly to the third preferred embodiment, the frequency of the individual resonators can be easily adjusted. In addition, since both the layered wiring 48A and the layered wiring 9A are provided, electrical resistance of a functional electrode 44 can be effectively reduced.

Figure 13:
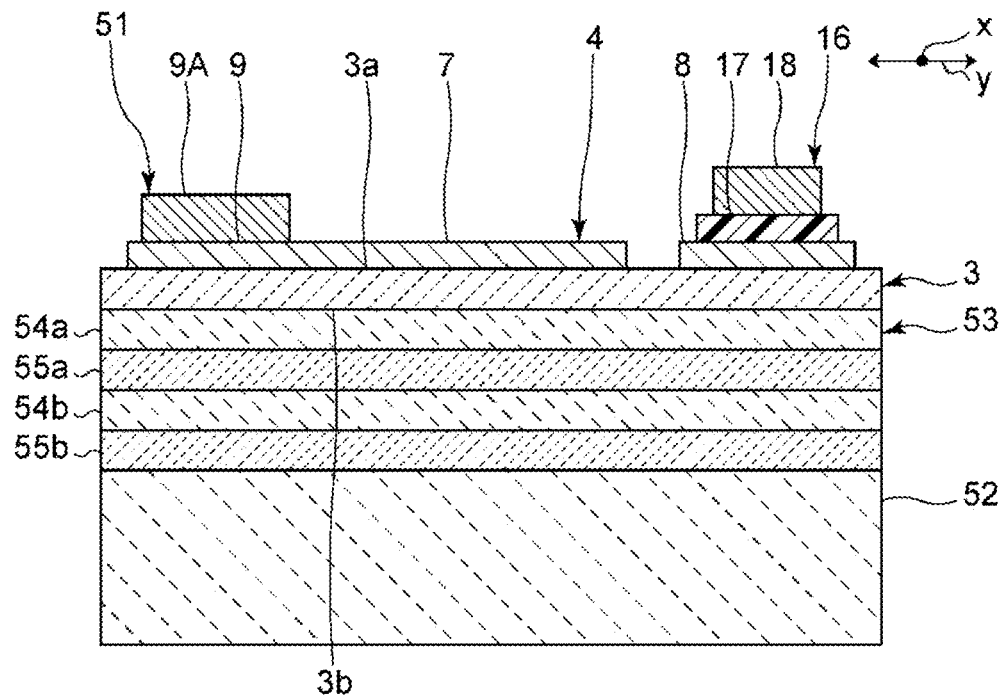
FIG. 13 is a sectional view illustrating a section of an acoustic wave resonator and a capacitor according to a fifth preferred embodiment of the present invention corresponding to the section taken along line I-I of FIG. 2.

FIG. 13 is a sectional view illustrating a section of an acoustic wave resonator and a capacitor according to a fifth preferred embodiment of the present invention corresponding to the section taken along line I-I of FIG. 2.

The differences between the present preferred embodiment and the first preferred embodiment are that an acoustic reflective film 53 is provided and a support substrate 52 does not include a cavity portion according to the present preferred embodiment. More specifically, the acoustic reflective film 53 is provided on the support substrate 52. The piezoelectric film 3 is provided on the acoustic reflective film 53. Other than the above-described points, the ladder filter according to the present preferred embodiment has the same or similar configuration to that of the ladder filter 10 according to the first preferred embodiment. According to the present preferred embodiment, the resonators share the acoustic reflective film 53.

The acoustic reflective film 53 is a multilayer body including a plurality of acoustic impedance layers. More specifically, the acoustic reflective film 53 includes a plurality of low acoustic impedance layers and a plurality of high acoustic impedance layers. The low acoustic impedance layers are layers having a relatively low acoustic impedance. The plurality of low acoustic impedance layers of the acoustic reflective film 53 include a low acoustic impedance layer 54a and a low acoustic impedance layer 54b. In contrast, the high acoustic impedance layers are layers having a relatively high acoustic impedance. The plurality of high acoustic impedance layers of the acoustic reflective film 53 include a high acoustic impedance layer 55a and a high acoustic impedance layer 55b. The low acoustic impedance layers and the high acoustic impedance layers are laminated in an alternating sequence. In the acoustic reflective film 53, the low acoustic impedance layer 54a is positioned closest to the piezoelectric film 3.

The acoustic reflective film 53 includes two low acoustic impedance layers and two high acoustic impedance layers. However, it is sufficient that the acoustic reflective film 53 include at least one low acoustic impedance layer and at least one high acoustic impedance layer.

Examples of the material of the low acoustic impedance layers can include silicon oxide, aluminum, and so forth. Examples of the material of the high acoustic impedance layers can include metal materials such as platinum and tungsten and dielectrics such as aluminum nitride and silicon nitride.

Also according to the present preferred embodiment, the frequency of an acoustic wave resonator 51 can be separately easily adjusted by adjusting the capacitance of the capacitor 16. Thus, similarly to the first preferred embodiment, the frequency of the individual resonators can be easily adjusted.

Hereinafter, examples of preferred Euler angles ($\varphi$, $\theta$, $\psi$) of a lithium niobate film or a lithium tantalate film as the piezoelectric film 3 are described. In the following, examples in which the piezoelectric film 3 is, for example, a lithium niobate film are described. However, the description can be applied also when the piezoelectric film 3 is, for example, a lithium tantalate film.

Figure 14:
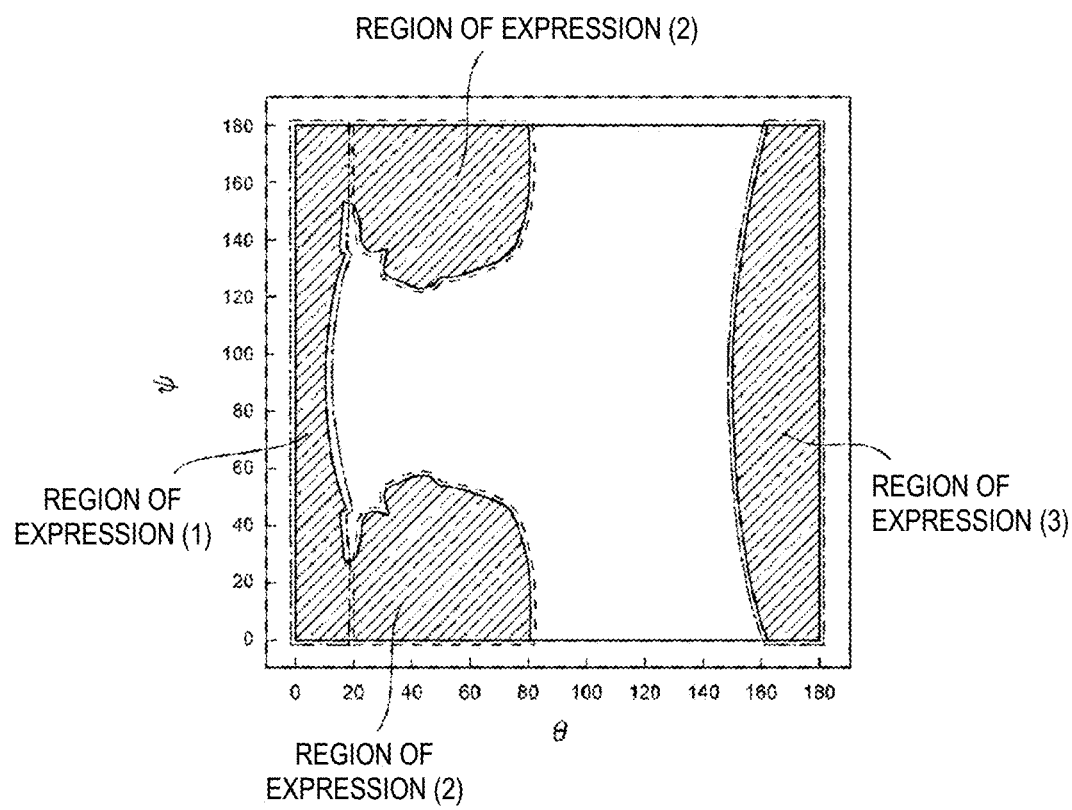
FIG. 14 is a diagram illustrating a map of the fractional bandwidth with respect to Euler angles $(0°, \theta, \psi)$ of $LiNbO_3$ when d/p is caused to approach limitlessly to 0.

FIG. 14 is a diagram illustrating a map of the fractional bandwidth with respect to the Euler angles (0°, θ, ψ) of LiNbO$_3$ when d/p is caused to approach limitlessly to 0. Hatched portions of FIG. 14 are regions in which a fractional bandwidth of at least about 5% can be obtained. When ranges of these regions are approximated, ranges represented by expression (1), expression (2), and expression (3) below are obtained.

$$(0°\pm10°, 0 \text{ to } 20°, \text{any } \psi) \qquad \text{expression (1)}$$

$$(0°\pm10°, 20 \text{ to } 80°, 0 \text{ to } 60°(1-(\theta-50)^2/900)^{1/2}) \text{ or}$$
$$(0°\pm10°, 20 \text{ to } 80°, [180°-60°(1-(\psi-50)^2/900)^{1/2}] \text{ to } 180°, \qquad \text{expression (2)}$$

$$(0°\pm10°, [180°-30°(1-(\psi-90)^2/8100)^{1/2}] \text{ to } 180°, \text{any } \psi) \qquad \text{expression (3)}$$

Accordingly, in the case of the Euler angle range of expression (1), (2), or (3) described above, it is preferable since the fractional bandwidth can be sufficiently increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
   a support substrate including a cavity portion and a support portion;
   a piezoelectric film including lithium niobate or lithium tantalate;
   an acoustic wave resonator including a functional electrode on the piezoelectric film;
   a capacitor on the piezoelectric film and connected in parallel to the acoustic wave resonator; and
   a resonator electrically connected to the acoustic wave resonator; wherein
   the support portion supports the piezoelectric film;
   the functional electrode includes at least one pair of a first electrode and a second electrode;
   the at least one pair of the first electrode and the second electrode face each other in a direction intersecting a thickness direction of the piezoelectric film; and
   when a thickness of the piezoelectric film is d and a center-to-center distance between the first electrode and the second electrode is p, d/p is smaller than or equal to about 0.5.

2. The filter according to claim 1, wherein the capacitor includes a first comb-shaped electrode on the piezoelectric film and electrically connected to the first electrode and a second comb-shaped electrode on the piezoelectric film, electrically connected to the second electrode, and interdigitated with the first comb-shaped electrode.

3. The filter according to claim 1, wherein an electrode electrically connecting the capacitor and the second electrode to each other is superposed on the support portion in plan view.

4. The filter according to claim 1, wherein the acoustic wave resonator is a series arm resonator or a parallel arm resonator, and the filter is a ladder filter.

5. The filter according to claim 1, wherein
Euler angles (φ, θ, ψ) of a lithium niobate film or a lithium tantalate film of the piezoelectric film fall within a range of expression (1), expression (2), or expression (3) below:

$$(0°+10°, 0 \text{ to } 20°, \text{any } \psi) \qquad \text{expression (1);}$$

$$(0°\pm10°, 20 \text{ to } 80°, 0 \text{ to } 60°(1-(\theta-50)^2/900)^{1/2}) \text{ or}$$
$$(0°\pm10°, 20 \text{ to } 80°, [180°-60°(1-(\psi-50)^2/900)^{1/2}] \text{ to } 180° \qquad \text{expression (2); and}$$

$$(0°\pm10°, [180°-30°(1-(\psi-90)^2/8100)^{1/2}] \text{ to } 180°, \text{any } \psi) \qquad \text{expression (3).}$$

6. The filter according to claim 1, wherein the acoustic wave resonator utilizes a bulk wave in a thickness slip mode.

7. The filter according to claim 1, wherein d/p is smaller than or equal to about 0.24.

8. The filter according to claim 1, wherein a thickness of the piezoelectric film is greater than or equal to about 40 nm and smaller than or equal to about 1000 nm.

9. The filter according to claim 1, wherein the at least one pair of the first electrode and the second electrode face each other in a direction orthogonal or substantially orthogonal the thickness direction of the piezoelectric film.

10. The filter according to claim 1, wherein the functional electrode is an interdigital transducer electrode.

11. The filter according to claim 1, wherein the functional electrode includes Al or an AlCu alloy.

12. The filter according to claim 1, wherein
the functional electrode includes an AlCu alloy; and
a Cu content in an AlCu alloy is greater than or equal to about 1 weight % and smaller than or equal to about 20 weight %.

13. A filter comprising:
a piezoelectric film including lithium niobate or lithium tantalate;
an acoustic wave resonator including a functional electrode on the piezoelectric film;
a capacitor on the piezoelectric film and connected in parallel to the acoustic wave resonator; and
a resonator electrically connected to the acoustic wave resonator; wherein
the functional electrode includes at least one pair of a first electrode and a second electrode;
the at least one pair of the first electrode and the second electrode face each other in a direction intersecting a thickness direction of the piezoelectric film;
when a thickness of the piezoelectric film is d and a center-to-center distance between the first electrode and the second electrode is p, d/p is smaller than or equal to about 0.5;
the functional electrode includes a first busbar and a second busbar that face each other;
the first electrode is connected to the first busbar, and the second electrode is connected to the second busbar; and
the capacitor includes the first busbar, an insulation film on the first busbar, and a capacitance electrode on the insulation film and electrically insulated from the first busbar.

14. The filter according to claim 13, wherein the first electrode and the second electrode are surrounded by an electrode electrically connecting the capacitor and the second busbar to each other, the first busbar, and the second busbar.

15. The filter according to claim 14, further comprising:
a first connection electrode and a second connection electrode on the piezoelectric film and electrically connecting the capacitance electrode and the second busbar to each other;
wherein the first electrode and the second electrode are surrounded by the first busbar, the second busbar, the first connection electrode, and the second connection electrode.

16. The filter according to claim 13, wherein
the capacitor is a first capacitor;
the filter further includes a second capacitor; and
the second capacitor includes a first comb-shaped electrode on the piezoelectric film and electrically connected to the first busbar and a second comb-shaped electrode on the piezoelectric film, electrically connected to the second busbar and the second electrode, and interdigitated with the first comb-shaped electrode.

17. The filter according to claim 13, wherein the insulation film includes an inclined portion.

18. The filter according to claim 13, wherein the insulation film covers one end portion of the first busbar, and does not cover another end of the first busbar.

19. A filter comprising:
a piezoelectric film including lithium niobate or lithium tantalate;
an acoustic wave resonator including a functional electrode on the piezoelectric film;
a capacitor on the piezoelectric film and connected in parallel to the acoustic wave resonator;
a resonator electrically connected to the acoustic wave resonator; and
an acoustic reflective film; wherein
the functional electrode includes at least one pair of a first electrode and a second electrode;
the at least one pair of the first electrode and the second electrode face each other in a direction intersecting a thickness direction of the piezoelectric film;
when a thickness of the piezoelectric film is d and a center-to-center distance between the first electrode and the second electrode is p, d/p is smaller than or equal to about 0.5;
the piezoelectric film is on the acoustic reflective film;
the acoustic reflective film includes at least one low acoustic impedance layer having a relatively low acoustic impedance and at least one high acoustic impedance layer having a relatively high acoustic impedance; and
the low acoustic impedance layer and the high acoustic impedance layer are laminated in an alternating sequence.

* * * * *